United States Patent [19]

Liepold et al.

[11] Patent Number: 5,202,590
[45] Date of Patent: Apr. 13, 1993

[54] SUBTHRESHOLD SENSE CIRCUIT FOR CLAMPING AN INJECTED CURRENT

[75] Inventors: Carl F. Liepold, Mesa; James T. Doyle, Chandler, both of Ariz.

[73] Assignee: Intel Corporation, Santa Clara, Calif.

[21] Appl. No.: 788,491

[22] Filed: Nov. 6, 1991

[51] Int. Cl.$^5$ .................. H03K 5/153; H03K 5/08; H03B 1/04
[52] U.S. Cl. .................. 307/362; 307/546; 307/548; 307/296.2; 307/568
[58] Field of Search .................. 307/362, 296.2, 540, 307/542, 546, 547, 548, 549, 550, 568

[56] References Cited

U.S. PATENT DOCUMENTS

| 4,443,717 | 4/1984 | Hague | 307/362 |
| 4,910,455 | 3/1990 | Nadd | 307/362 |
| 4,965,468 | 10/1990 | Nicollini et al. | 307/362 |
| 5,087,834 | 2/1992 | Tsay | 307/358 |
| 5,113,092 | 5/1992 | Herold | 307/356 |

Primary Examiner—William L. Sikes
Assistant Examiner—Toan Tran
Attorney, Agent, or Firm—Blakely, Sokoloff, Taylor & Zafman

[57] ABSTRACT

A subthreshold sense circuit for clamping an injected current at the input pins of an integrated circuit device before the injected current causes the voltage at the input pins to exceed the supply voltage by more than a diode's ON voltage. The subthreshold sense circuit is driven to operate in the linear region of the FETs. The subthreshold sense circuit of the present invention comprises level shifters, a subthreshold current source, a reference voltage generator, a subthreshold comparator, and a clamping circuit. The subthreshold current source generates a reference drain current to drive the sense circuit of the present invention in the linear region. A level shifter is connected to an input pin to shift the voltage level of the input pin by a subthreshold voltage level. The reference voltage generator provides a reference voltage to be compared with the subthreshold-shifted input voltage. The subthreshold comparator compares the subthreshold-shifted input voltage with the reference voltage level such that when the subthreshold-shifted input voltage from the input pin exceeds the reference voltage level, the subthreshold comparator will turn on. The clamping circuit is activated by the subthreshold comparator to clamp the input pin to less than one $V_D(ON)$ drop over the supply voltage by sinking the injected current at the input pin when the subthreshold comparator is turned on.

11 Claims, 6 Drawing Sheets

SUBTHRESHOLD SENSE CIRCUIT FOR CLAMPING AN INJECTED CURRENT

BACKGROUND OF THE INVENTION

1. FIELD OF THE INVENTION

The present invention relates to the field of integrated circuits, and specifically, sensing of injected currents at the input pins of the integrated circuits.

2. ART BACKGROUND

It is well known in the art to use integrated circuits containing microcontrollers in applications such as closed-loop control and digital signal processing. Such applications are widely utilized in products such as modems, motor controls, engine controls and medical instrumentation, to name just a few. In the field of microcontrollers, it is also common to implement an on-chip analog-to-digital (A/D) converter to convert analog input signals into digital signals to be processed by the controller. However, because a microcontroller chip is quite often operating in a noisy environment, such as in an automobile input pins connected to the on-chip A/D converter frequently experience injected currents caused by sporadic voltage spikes in the proximity of the integrated circuit device.

When there is sufficient injected current present, a parasitic diode 100 at the input pin, such as the one shown in FIG. 1, becomes forward biased due to the voltage spike. As a result, input voltages to the A/D converter pins begin ramping up or down, thus affecting the analog comparison to be performed during the A/D conversion. This problem is typically avoided by connecting discrete external parts, such as Schottky diodes with their lower turn-on voltage, to the input pins to clamp the voltages at the input pins to less than one forward diode's ON voltage drop ("$V_D(ON)$") beyond the supply voltage such that the parasitic diodes are not forward biased by the injected current. However, as the number of pins increases due to larger and larger scales of integration, more external parts are required for the pins on each chip, making this solution impractical and expensive. Also, attempts have been made to fabricate on-chip Schottky diodes in the same process. However, various semiconductor process limitations make implementing Schottky diodes on-chip an unsuitable solution. As such, an on-chip circuit to sense and clamp an injected current becomes a preferable solution in view of the process limitations confronted by the prior art. Also, because microcontrollers often must operate in environments with varying ambient temperature, an on-chip sense circuit must be able to track the threshold behavior of the parasitic diodes independent of the varying temperature to be completely effective.

As will be described in the following description, the present invention provides a circuit that senses and clamps an injected current at each of the input pins of an integrated circuit device. When sensing an injected current at the input pin, the circuit sinks the injected current to prevent the injected current from forward-biasing the parasitic diode and degrading the accuracy of the A/D converter. The sense circuit of the present invention is ideally suited for use in sensing and clamping an injected current at each of the pins as part of an integrated circuit. In addition, the sense circuit can be easily fabricated as an integral part of the semiconductor circuit which contains the microcontroller and the A/D converter. Furthermore, the sense circuit is able to track the threshold behavior of the input parasitic diode despite the temperature variations.

SUMMARY OF THE INVENTION

Therefore, it is an object, feature, and purpose of the present invention to prevent the input parasitic diodes from becoming forward biased by an injected current at the input pins of an integrated circuit.

It is also an object of the present invention to sense the injected current at the input pins of an integrated circuit.

It is further an object of the present invention to clamp the input pins to less than one $V_D(ON)$ over the supply voltage when an injected current at the input pin is sensed.

It is another object of the present invention to provide a low-load active sense circuit to be fabricated on-chip with the integrated circuit.

A subthreshold sense circuit is disclosed for clamping an injected current at each of the input pins of an integrated circuit device before the injected current causes the voltage at each of the input pins to exceed the supply voltage by more than one $V_D(ON)$. The subthreshold sense circuit is driven to operate in the linear region of the field-effect transistors (FET). The subthreshold sense circuit of the present invention comprises level shifters, a subthreshold current source, a reference voltage generator, a subthreshold comparator, and a clamping circuit. The subthreshold current source generates a reference drain current to drive the subthreshold sense circuit of the present invention in the linear region. The level shifters are connected to the input pin to shift the voltage level of the input pin by subthreshold voltage drops. The reference voltage generator provides a reference voltage to be compared with the subthreshold-shifted input voltage. The subthreshold comparator compares the subthreshold-shifted input voltage with the reference voltage level such that when the subthreshold-shifter input voltage from the input pin exceeds the reference voltage level, the subthreshold comparator will turn on. The clamping circuit is activated by the subthreshold comparator to clamp the input pin to less than one $V_D(ON)$ drop over the supply voltage by sinking the injected current at the input pin when the subthreshold comparator is turned on.

BRIEF DESCRIPTION OF THE DRAWINGS

Additional objects and features of the present invention will be apparent to those skilled in the art from the following description of the present invention, in which.

DETAILED DESCRIPTION OF THE INVENTION

In the following description, numerous specific details are set forth such as voltages, currents, device types, etc. in order to provide a thorough understanding of the present invention. It will be obvious, however, to one skilled in the art that these details are not required to practice the present invention. In other instances, well known circuits, methods and the like are not set forth in detail in order to avoid unnecessarily obscuring the present invention.

Figure 1:
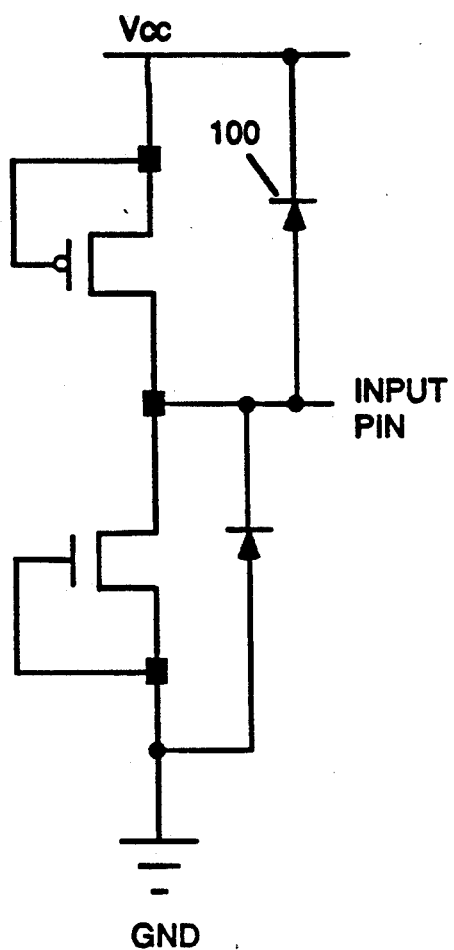
FIG. 1 is a simplified schematic drawing showing a parasitic diode at the input protection circuit of an integrated circuit.
Figure 2:
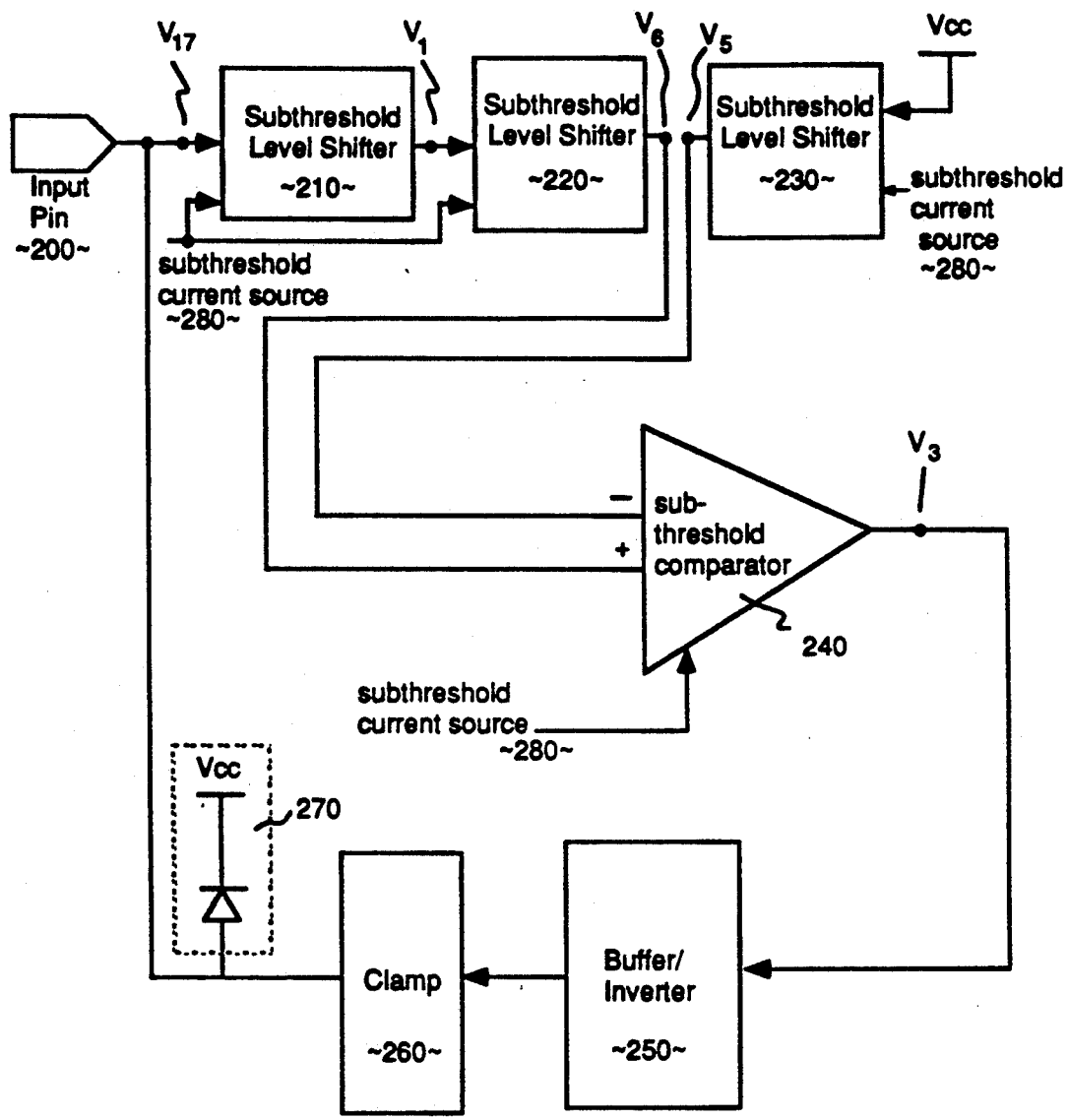
FIG. 2 is a block diagram showing the various functional components of the invented subthreshold sense circuit.

A simplified block diagram of the invented subthreshold sense circuit is shown in FIG. 2. Input pin 200 of an A/D converter portion of a microcontroller chip is connected to subthreshold level shifter 210, which becomes operative when the voltage from input pin 200 exceeds the supply voltage by more than 0.3 volts. It should be appreciated by those skilled in the art that 0.3 volts is set to prevent the parasitic diode, which normally turns on at about 0.45 volts, from becoming forward biased. Additionally, it will be apparent that 0.3 volts is ideal for this purpose because the sense circuit will begin to clamp about 100 mV before diode conduction, but will not be activated for small noise ripples on the chip. The output from subthreshold level shifter 210 is level shifted by subthreshold level shifter 220 by two subthreshold voltage drops. This subthreshold-shifted input voltage from level shifter 220 is input to the positive input terminal of subthreshold comparator 240. The negative input to subthreshold comparator 240 is generated by level shifting the supply voltage Vcc through level shifter 230 to produce a reference voltage. Level shifters 210, 220, 230, and subthreshold comparator 240 are driven by a subthreshold current source 280 such that these components operate in the linear region of a FET. The output of subthreshold comparator 240 is amplified by inverter/driver circuit 250 to produce a sufficient current to drive clamp circuit 260, which is connected to input pin 200 of an integrated circuit device. As shown in FIG. 1, parasitic diode 270 is formed at input pin 200 as a result of the electrostatic discharge (ESD) protection circuit. Similarly, the parasitic diodes are also formed at output driver circuits (not show) when they are present.

Figure 3:
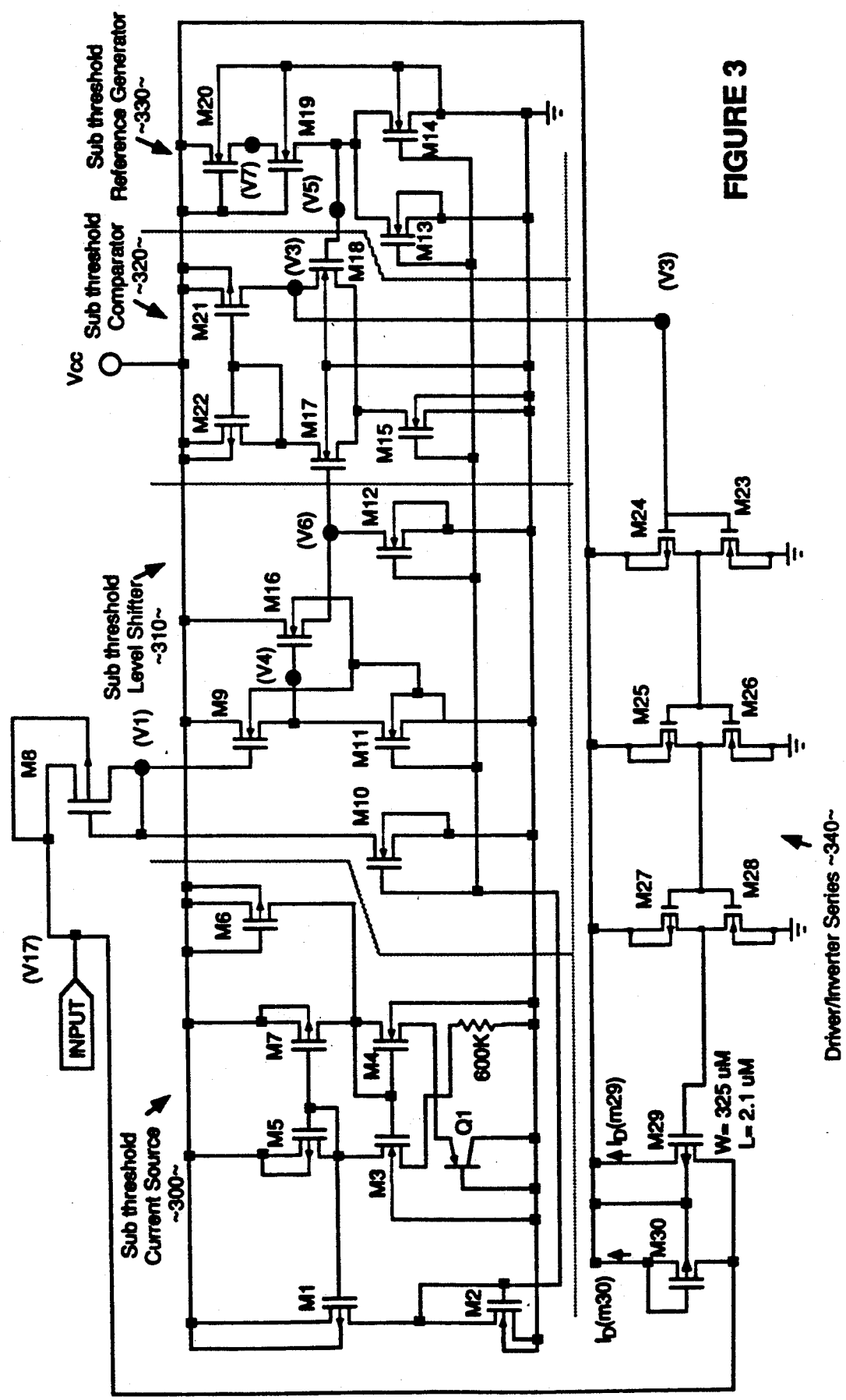
FIG. 3 is a schematic diagram showing the preferred embodiment of the present invention.

Reference is now made to FIG. 3, where a schematic diagram of the preferred embodiment of the present invention is shown. The input pin is connected to subthreshold level shifter component 310 comprising transistors M8, M9, M10, M11, M12, and M16. Transistor M8 has its drain coupled to the input pin, its body coupled to the drain, its gate coupled to the drain of transistor M10, and its source coupled to the gate of transistor M9. Transistor M8 is subthreshold-operated and connected as a diode to provide the 0.3 volts drop from node V17 to node V1. Node V1 is at the source-gate connection of transistor M8. Node V4 is at the connection among the gate of transistor M16 source of transistor M9 and drain of transistor M11. Currently, the body of transistors M9, M10, M11, M12, and M16 are grounded. Node V6 is at the connection among the source of transistor M16, gate of transistor M17 and the drain of transistor M12. The gates of transistors M10, M11 and M12 are coupled to a subthreshold current from the subthreshold current source component 300. Transistors M10, M11 and M12 are coupled as current mirrors to provide a bias current to transistors M8, M9, and M16, respectively. Node V6 is coupled to the positive input to the subthreshold comparator 320 as shown in FIG. 2.

With reference to FIG. 3, the subthreshold comparator 320 comprises transistors M15, M17, M18, M21 and M22. Transistors M21 and M22 have their gates coupled to the drain of transistor M17. The bodies of transistors M21 and M22 are coupled to their drains, which are coupled to the supply voltage. Transistors M21 and M22 are the active load transistors. Transistors M17 and M18 have their sources coupled to the drain of transistor M15. Transistor M15 has its gate driven by the subthreshold current from the subthreshold current source 300. Node V3 is at the source-drain connection between transistors M21 and M18, respectively. Transistor M15 acts as a current source to supply the differential pair transistors M17 and M18. The output of the subthreshold comparator 320 is at node V3. Currently, the body of transistors M15, M17, and M18 are grounded, while the body of transistors M21 and M22 are coupled to the power supply.

With reference to FIG. 3, node V5 represents a reference voltage input to the subthreshold comparator 320 at the gate of transistor M18, i.e. node V5. Subthreshold reference generator 330 is constructed with two current sources in parallel and two voltage-drop transistors in series. The supply voltage Vcc is coupled to the gates of transistors M20 and M19. Node V7 is at the source-drain connection of transistors M20 and M19, respectively. Node V5 is between the source of transistor M19 and the drains of transistors M13 and M14. Both gates of transistors M13 and M14 are driven by the subthreshold reference current from the subthreshold current source 300. The body of transistors M20, M19, M14 and M13 are grounded.

With reference still made to FIG. 3, the subthreshold current source 300 is formed by transistors M1, M2, M3, M4, M5, M6, M7 and Q1. The subthreshold current source 300 generates a subthreshold current to drive the subthreshold level shifter 310, subthreshold comparator 320 and subthreshold reference 330 at the gates of transistors M10, M11, M12, M13, M14 and M15. The gates of transistors M1, M5 and M7 are coupled to the drain of transistor M3. The gates of transistors M3 and M4 are coupled to the sources of transistors M6 and M7. The source of transistor M4 is coupled to the emitter of a diode-connected PNP transistor Q1, which has its base and collector grounded. The body of transistors M1, M5, M7, and M6 are coupled to the supply voltage Vcc, while the body of transistors M2, M3, and M4 are coupled to the ground. The gate and drain of transistor M6 are coupled to the supply voltage Vcc.

It should be appreciated by those skilled in the art that the reference current from subthreshold current source 300 may be temperature-compensated due to the use of $V_{BE}$ of transistor Q1, $V_{GS}$ of transistor M3 and M4 and the currently used 600 K-ohm resistor.

With reference still made to FIG. 3, the driver circuit 340 is shown comprising a series of inverters using transistors M23 through M28. The output of inverter M27-M28 is coupled to the gate of transistor M29. The sources of transistor M29 and M30 are coupled to the input pin at node V17. The body of transistors M29 and M30 are coupled to the supply voltage Vcc and their drains.

As will be apparent to those skilled in the art, a diode-connected, subthreshold-operated FET has a source-to-drain voltage ("$V_{SD}$") drop that is less than the normal threshold voltage of an FET, typically about 1 volt. As shown in FIG. 3, transistors M8, M9, M10, M11, M12 and M16 forming the subthreshold level shifters are driven in the linear region, where the current through the transistor is linearly proportional to the gate voltage. It should be obvious to those skilled in the art that other level shifting combinations may be used to lower the input voltage by at least one subthreshold drop for the subthreshold comparator 320 to detect voltage spikes exceeding the supply voltage, which is caused by the injected current. The output of the subthreshold comparator 320 appears at node V3, which is applied through a series of drivers and inverters 340 to drive clamp circuit M29.

Referring still to FIG. 3, the operation of a subthreshold sense circuit is described as follows. When an injected current ramping from 0 mA to 10 mA occurs at node V17, a voltage spike is generated at node V17. The level of the voltage spike at node V17 is level shifted by a subthreshold drop of 0.5 volts across transistor M8 and by less than twice the $V_{SD}$ drop across transistors M9 and M16. The subthreshold-shifted input voltage from the voltage spike at node V17 is generated at node V6 as a positive input to the subthreshold comparator 320 at node V6. A reference voltage at node V5 is generated by level shifting the supply voltage Vcc (maintained at 5.0 volts) down two $V_{SD}$ drops. When the voltage level at node V6, as a result of an injected current, exceeds the reference voltage at node V5, the subthreshold comparator 320 is turned on and on output voltage appears at node V3. With appropriate amplification through the driver/inverter series 340, the injected current to the input pin is sunk up by pull-up transistor M29 before the injected current can forward bias the parasitic diode in transistor M30 at the input pin. Although an inverter/driver series 340, i.e. transistors M23 through M28, is currently utilized to drive a much larger clamp transistor M29 with width and length at 325 micron and 2.1 micron, respectively, it should be apparent to those skilled in the art that a different clamp transistor may require a different inverter/driver series to achieve the same effect.

Figure 4:
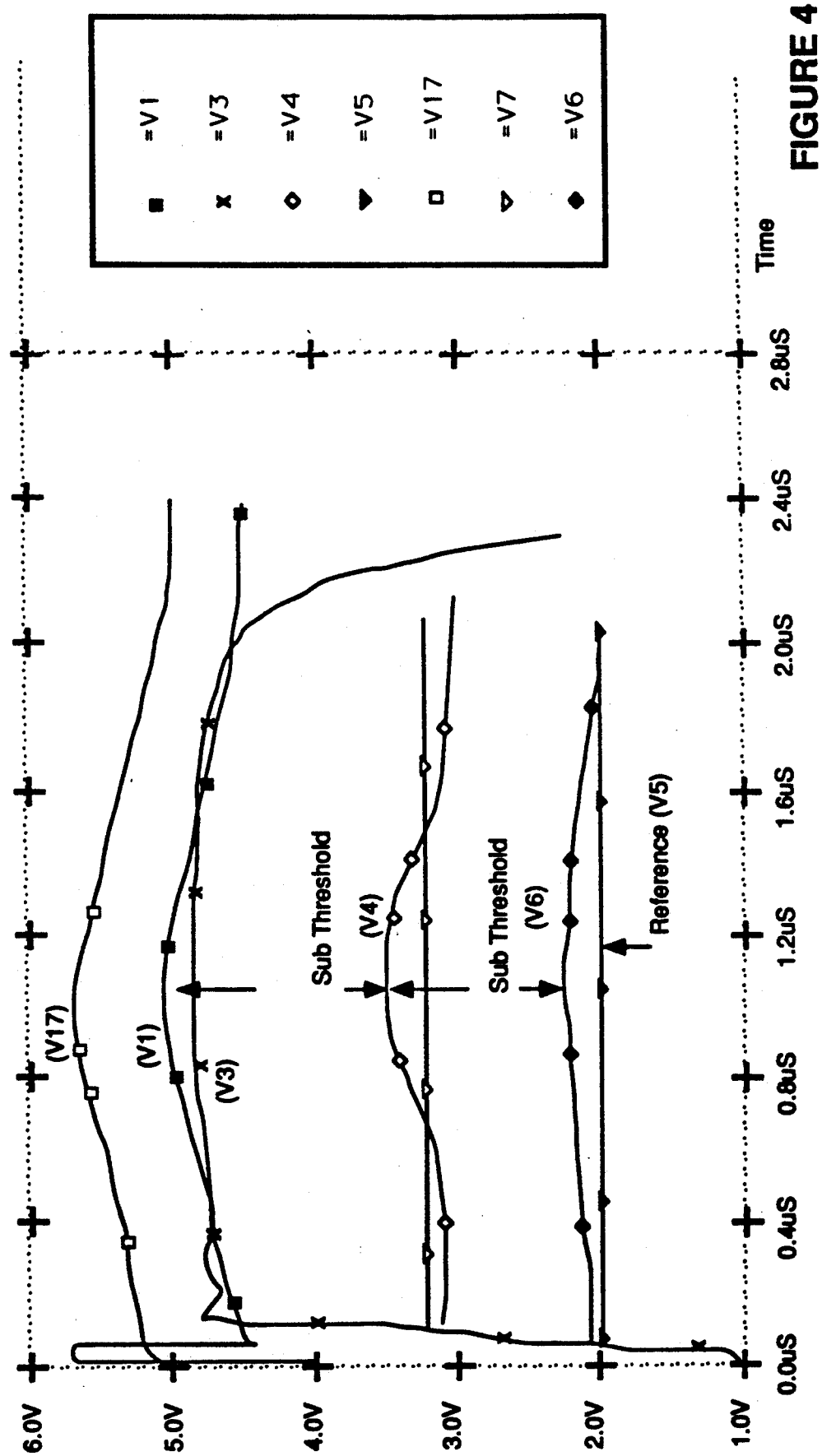
FIG. 4 illustrates a simulated test result of the voltage levels at various nodes as a function of time with the implementation of the present invention.
Figure 5:
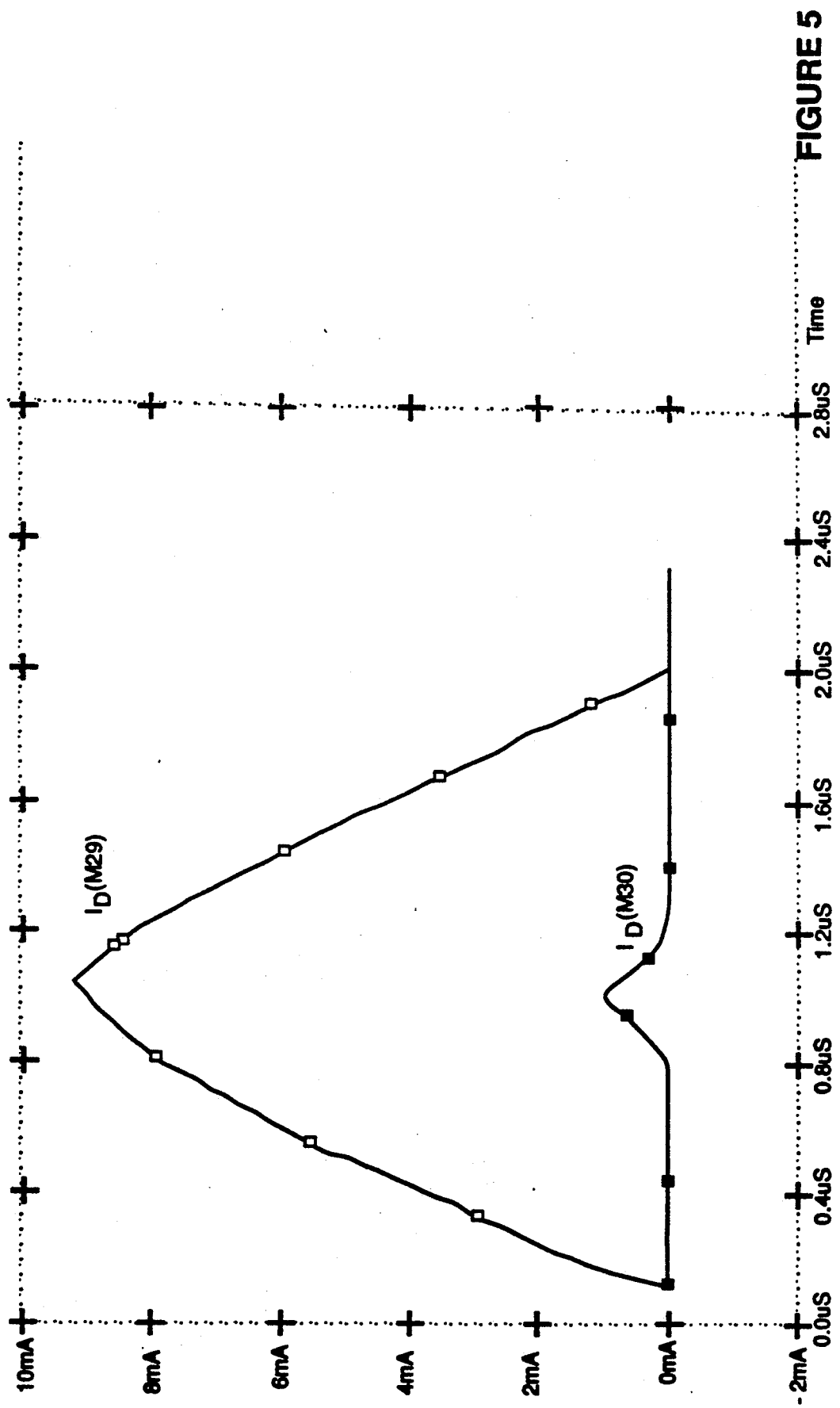
FIG. 5 illustrates a simulated test result of the drain currents through the pull-up transistor and through the parasitic diode.

Reference is now made to FIG. 4, where a simulated result of the various voltage nodes is shown. As illustrated in FIG. 4, the voltage at node V17 was first reduced by a subthreshold voltage of approximately 0.5 volts to become a lower voltage level at node V1. The voltage at node V1 was level shifted down by subthreshold $V_{SD}$ twice to become lower voltage levels at nodes V4 and V6. Reference voltage V5 was produced by level shifting the supply voltage Vcc in a similar manner. As also shown in FIG. 5, the drain current $I_D$ in transistor M30 was clamped by having the drain current $I_D$ in transistor M29 sink up to 10 mA when the injected current occurred at the input pin, causing the input voltage to exceed its supply voltage Vcc by more than 0.3 volts.

Figure 6:
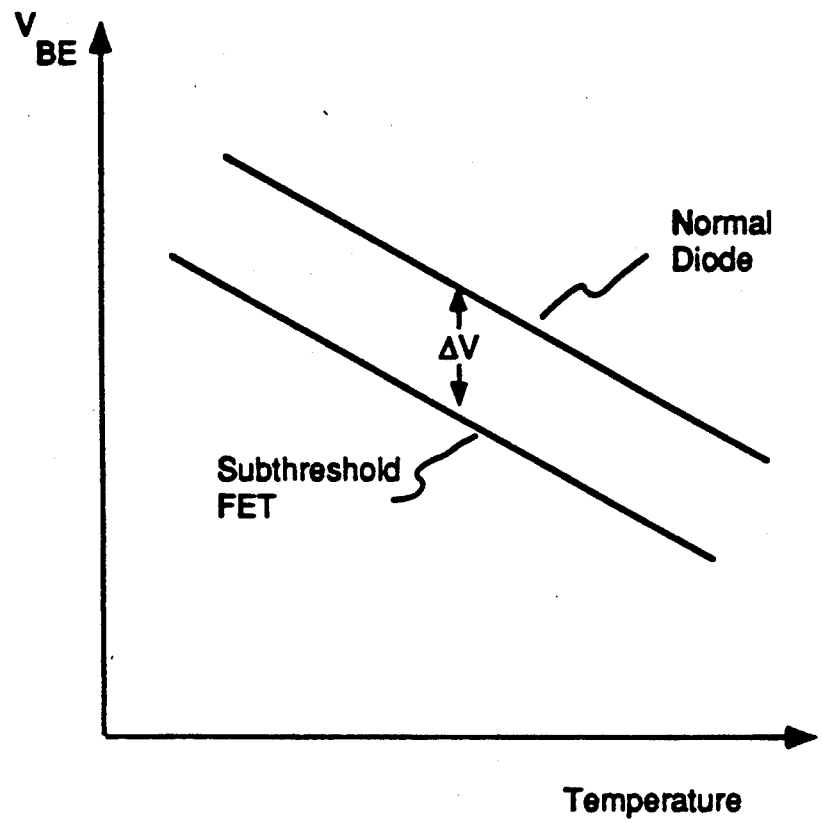
FIG. 6 illustrates the threshold behaviors of a subthreshold transistor and a normal diode with respect to a varying ambient temperature.

Reference is now made to FIG. 6, where a threshold voltage-temperature chart for both a normal diode and a subthreshold FET is shown. As shown in FIG. 6, the subthreshold-operated transistor is able to track the threshold behavior of a normal diode, such as a parasitic diode, in a $V_{BE}$ versus temperature chart in parallel with the normal diode. As shown in FIG. 6, the drain current across a transistor operating in a subthreshold region has the same slope as the diode current, which is related to $V_{BE}$ as provided by $V_{BE}=(kT/q)\ln(Ic/Is)$ with kT and q being the thermal energy in eV and electron charge in Coulomb, respectively. Thus, the delta-V, i.e. the difference in threshold voltages between the normal diode and the subthreshold-operated transistor remains constant despite the temperature changes. As such, a subthreshold-operated transistor can maintain its sensing and clamping functions even in temperature-varying environments because a subthreshold-operated comparator will be activated before the parasitic diode so as to avoid forward biasing the parasitic diode at the input pin. Another advantage of the subthreshold transistor over different-area diodes is that the higher slope factor ("$\eta$") of a MOSFET translates into lower voltage drop across the transistor than the diodes. As such, a subthreshold comparator will always turn on before the parasitic diode does. Furthermore, because the transistors operate in a subthreshold region, they require very low power and generate low load on the integrated circuit.

It should be appreciated by those skilled in the art that the subthreshold circuit of the present invention may have applications beyond clamping injected current in the current implementation. For example, the ability to detect voltage drops of 0.3 volt can effectively extend circuit operations beyond the power rails of a device by almost 0.3 volt by acting as a regulator to prevent substrate diodes from turning on while running the device by more than the rails but less than the 0.3 volt ceiling. For integrated circuits with 1 volt power supply, an extension of ±0.3 volt beyond the power rails is a 60% increase in their operating voltage. The devices' performance can thus be enhanced by the higher operating voltages regulated by the subthreshold circuit.

Whereas many alterations and modifications at the present invention will no doubt become apparent to a person of ordinary skill in the art after having read the foregoing description, it is to be understood that the particular embodiments shown and described by way of illustration are no way intended to be considered limiting. For example, use of negative supply voltage in an opposite polarity would be well within the spirit and scope of the present invention. Furthermore, the circuit can be "reflected" to clamp negative voltage drops on the input pin to prevent errors from injected currents in the opposite direction. Therefore, reference to the details of the preferred embodiments are not intended to limit the scope of the claims which themselves recite only those features regarded as essential to the invention.

We claim:

1. A subthreshold comparator for detecting a voltage difference between an input voltage and a subthreshold voltage, comprising:
  subthreshold current source means for generating a subthreshold current;
  comparator means coupled to said subthreshold current source means to be driven by said subthreshold current, said comparator means comparing said input voltage with said subthreshold voltage, said comparator means being turned on when said input voltage exceeds said subthreshold voltage, said comparator means comprising:
    first and second FETs having their gates connected together, said gates of said first and second FETs being coupled to the source of said first FET;
    third and fourth FETs having their sources connected together, the drain of said third FET being coupled to the source of said first FET, the drain of said fourth FET being coupled to the source of said second FET to form an output node, the gates of said third and fourth FETs being first and second input nodes to receive said input and subthreshold voltages, respectively, said output node being pulled up when said first input node has a voltage above said second input node; and fifth FET having its drain coupled to the sources of said third and fourth FETs, said fifth FET being driven by said subthreshold current from said subthreshold current source means such that said subthreshold current drives said fifth FET in the linear region, wherein the drain current through said fifth FET is linearly propertional to its drain voltage.

2. A subthreshold sense circuit for preventing a voltage spike of a first predetermined voltage at one of a plurality of input pins and output pins of an integrated circuit from forward biasing a parasitic diode between said pin and a power supply source, and clamping said pin to have a voltage less than said first predetermined voltage, comprising:

subthreshold current source means for generating a subthreshold current;

level shifter means connected to said pin for shifting the voltage at said pin down by a second predetermined voltage to generate a subthreshold-shifted input voltage, said level shifter means being driven by said subthreshold current from said subthreshold current source means to generate said subthreshold-shifted input voltage;

reference generator means coupled to said subthreshold current source means for generating a reference voltage, said reference generator means being driven by said subthreshold current from said subthreshold current source means;

subthreshold comparator means coupled to said level shifting means and to said reference generator means for comparing said subthreshold-shifted input voltage with said reference voltage, said subthreshold comparator means being driven by said subthreshold current, said subthreshold comparator means outputting a control voltage when said subthreshold-shifted input voltage exceeds said reference voltage; and clamping transistor coupled to said subthreshold comparator means and said pin for clamping the voltage at said pin to less than said first predetermined voltage, said clamping transistor having its drain and source connected to said power supply source and said pin, respectively, said clamping transistor turning on in response to said control signal from said comparator means to pull the voltage at said pin up toward said power supply source such that said voltage spike at said pin does not cause said parasitic diode to be forward biased.

3. A subthreshold sense circuit according to claim 2, wherein said level shifter means comprises:

an FET having its drain connected to said input and its source connected its gate for shifting the voltage at said input down by one diode drop to produce a first shifted input at its source-gate connection;

first level shifter means coupled to said FET for shifting said first shifted input by one subthreshold voltage to produce a second shifted input, said first level shifter means being driven by said subthreshold current; and second level shifter means coupled to said first level shifter means for further shifting said second shifted input by one subthreshold voltage, said second level shifter means being driven by said subthreshold current.

4. A subthreshold sense circuit according to claim 2, wherein said comparator means comprises:

first and second FETs having their gates connected together, said gates of said first and second FETs being coupled to the source of said first FET;

third and fourth FETs having their sources connected together, the drain of said third FET being coupled to the source of said first FET, the drain of said fourth FET being coupled to the source of said second FET to form an output node, the gates of said third and fourth FETs being first and second input nodes to receive said subthresholdshifted input voltage and reference voltages, respectively; and fifth FET having its drain coupled to the sources of said third and fourth FETs, said fifth FET being driven by said subthreshold current at its gate such that said output node is pulled up if said subthreshold-shifted input voltage exceeds said reference voltage by more than a forward diode voltage drop.

5. A subthreshold circuit according to claim 4, further comprising driver means coupled between said subthreshold comparator and said clamping transistor for amplifying said control voltage from said subthreshold comparator when said subthreshold comparator is turned on.

6. A subthreshold circuit according to claim 5, wherein said clamping transistor is P-channel FET having channel width and length at 325 micron and 2.1 micron, respectively.

7. A subthreshold circuit according to claim 5, wherein said driver means comprises a plurality of FET inverters for driving said control voltage from said subthreshold comparator.

8. A subthreshold circuit according to claim 2, wherein said reference generator means comprises:

first FET coupled to the power supply at its drain, its gate being also coupled to the power supply, its body being coupled to the ground;

second FET serially coupled to said first FET, the gate and drain of said second FET respectively being coupled to the source and gate of said first FET, its body being coupled to the ground, a parallel transistor pair coupled to said second FET, said transistor pair having its gates driven by said subthreshold current, the body and the sources of said transistor pair being coupled to ground, the drains of said transistor pair being coupled to the source of said second FET to form an output node of said reference generator means.

9. A subthreshold circuit according to claims 3, wherein said reference generator means comprises:

first FET coupled to the power supply at its drain, its gate being also coupled to the power supply, its body being coupled to the ground;

second FET serially coupled to said first FET, the gate and drain of said second FET respectively being coupled to the source and gate of said first FET, its body being coupled to the ground;

a transistor pair coupled to said second FET, said transistor pair having its gates driven by said subthreshold current, the body and the sources of said transistor pair being coupled to ground, the drains of said transistor pair being coupled to the source of said second FET to form an output node of said reference generator means.

10. A subthreshold circuit according to claims 2, wherein said subthreshold current source means comprises:
- first, second and third FETs having their gates connected together, the drains of said first, second and third FETs being coupled to the supply voltage, the body of said first, second and third FETs being coupled to the supply voltage, the source of said second FET being coupled to the gates of said first, second and third FET;
- fourth and fifth FETs having their gates coupled to the source of said third FET and to the drain of said fifth FET, the drain of said fourth FET being coupled to the gates of said first, second and third FETs, the body of said fourth and fifth FETs being coupled to the ground;
- sixth FET having its source coupled to the gates of said fourth and fifth FETs, said sixth FET having its gate, drain and body coupled to the supply voltage;
- PNP transistor coupled to the source of said fifth transistor at its emitter, the base and collector of said PNP transistor being coupled to the ground;
- resistor means coupled between the source of said fourth FET and the ground; and
- seventh FET having its gate and drain connected to the source of said first FET to generate a subthreshold current, the body and source of said seventh FET being coupled to the ground.

11. A subthreshold circuit according to claims 3, wherein said subthreshold current source means comprises:
- first, second and third FETs having their gates connected together, the drains of said first, second and third FETs being coupled to the supply voltage, the body of said first, second and third FETs being coupled to the supply voltage, the source of said second FET being coupled to the gates of said first, second and third FET;
- fourth and fifth FETs having their gates coupled to the source of said third FET and to the drain of said fifth FET, the drain of said fourth FET being coupled to the gates of said first, second and third FETs, the body of said fourth and fifth FETs being coupled to the ground;
- sixth FET having its source coupled to the gates of said fourth and fifth FETs, said sixth FET having its gate, drain and body coupled to the supply voltage;
- PNP transistor coupled to the source of said fifth transistor at its emitter, the base and collector of said PNP transistor being coupled to the ground;
- resistor means coupled between the source of said fourth FET and the ground; and
- seventh FET having its gate and drain connected to the source of said first FET to generate a subthreshold current, the body and source of said seventh FET being coupled to the ground.

* * * * *